United States Patent
Shoki et al.

(10) Patent No.: US 7,056,627 B2
(45) Date of Patent: Jun. 6, 2006

(54) METHOD OF MANUFACTURING A REFLECTION TYPE MASK BLANK AND METHOD OF MANUFACTURING A REFLECTION TYPE MASK

(75) Inventors: Tsutomu Shoki, Tokyo (JP); Morio Hosoya, Tokyo (JP); Takeru Kinoshita, Tokyo (JP)

(73) Assignee: Hoya Corporation, Tokyo (JP)

( * ) Notice: Subject to any disclaimer, the term of this patent is extended or adjusted under 35 U.S.C. 154(b) by 238 days.

(21) Appl. No.: 10/644,964

(22) Filed: Aug. 21, 2003

(65) Prior Publication Data

US 2005/0100797 A1 May 12, 2005

(30) Foreign Application Priority Data

Aug. 23, 2002 (JP) .............................. 2002-242923

(51) Int. Cl.
*G01F 9/00* (2006.01)
(52) U.S. Cl. ......................................................... 430/5
(58) Field of Classification Search ................... 430/5, 430/311, 330; 428/428
See application file for complete search history.

(56) References Cited

U.S. PATENT DOCUMENTS

| 6,309,705 B1 | 10/2001 | Montcalm et al. | |
| 6,352,803 B1 * | 3/2002 | Tong et al. | 430/5 |
| 6,696,205 B1 * | 2/2004 | Brooks et al. | 430/5 |

FOREIGN PATENT DOCUMENTS

| JP | 8-213303 A | 8/1996 |
| JP | 2002-15981 A | 1/2002 |

* cited by examiner

*Primary Examiner*—S. Rosasco
(74) *Attorney, Agent, or Firm*—Sughrue Mion, PLLC (57) ABSTRACT

A method of manufacturing a reflection type mask blank by forming a multilayer reflection film reflecting exposure light on a substrate and forming an absorber layer absorbing the exposure light on the multilayer reflection film includes a step of forming, between the substrate and the multilayer reflection film, a stress correction film opposite in direction to film stress of the multilayer reflection film and smaller in absolute value than the film stress of the multilayer reflection film, a step of heat-treating the stress correction film, and a step of heat-treating the multilayer reflection film.

11 Claims, 2 Drawing Sheets

METHOD OF MANUFACTURING A REFLECTION TYPE MASK BLANK AND METHOD OF MANUFACTURING A REFLECTION TYPE MASK

This application claims priority to prior Japanese application JP 2002-242923, the disclosure of which is incorporated herein by reference.

BACKGROUND OF THE INVENTION

This invention relates to a method of manufacturing a reflection type mask blank for exposure for use in a pattern transfer of a semiconductor device and a method of manufacturing a reflection type mask.

In a recent semiconductor industry, with miniaturization of a semiconductor device, EUV lithography as an exposure technique using Extreme Ultra Violet light (will hereinafter be abbreviated to EUV light) is promising. It is noted here that the EUV light means light having a wavelength band within a soft X-ray region or a vacuum ultraviolet ray region, more specifically, light having a wavelength of about 0.2–100 nm. As a mask used in the EUV lithography, a reflection type mask for exposure is proposed, for example, as disclosed in Japanese Unexamined Patent Publication No. 8-213303.

Such a reflection type mask comprises a multilayer reflection film formed on a substrate for reflecting the EUV light, and an absorber layer patterned on the multilayer reflection film for absorbing the EUV light.

In an exposure machine (pattern transfer apparatus) to which the reflection type mask is mounted, light incident to the reflection type mask is absorbed at a part having the absorber layer and, at another part without the absorber layer, reflected by the multilayer reflection film to form an image, which is transferred through a reflection optical system onto a semiconductor substrate (silicon wafer).

In such a reflection type mask using the multilayer reflection film, however, it is required to increase a film density of each layer of the multilayer film in order to obtain a high reflectance with respect to light having a short wavelength. As a consequence, the multilayer reflection film inevitably has a high compression stress. As the multilayer reflection film, for example, having a high reflectance for the EUV light of 13–14 nm, use is made of a film in which thin films of Si and Mo on the order of several tens nanometers are alternately laminated. In this event, however, if the multilayer film is dense, the compression stress is generally as high as about 450–600 MPa.

Due to such a high compression stress, the substrate is largely warped (deformed) into a convex plane. As a result, warp occurs also on the surface of the multilayer reflection film serving as a reflection surface for the EUV light. For example, upon manufacturing a device under a 65 nm rule, flatness not greater than 100 nm is necessary. For example, in case where the compression stress of 200 MPa is applied to the multilayer film of 0.3 µm thick formed on a quartz glass substrate of 6 inch square and 6.35 mm thick, warp (deformation) of about 500 nm occurs in an area of 140 mm square. In order to suppress such deformation to 100 nm, the stress must be reduced to about 50 MPa or less.

If the compression stress of the multilayer film is large as described above, the warp of the surface of the multilayer reflection film causes the decrease in transfer accuracy (image placement error) during transfer to the wafer. This results in a problem that high-accuracy transfer is impossible. In order to solve this problem, it is attempted to reduce the influence of the stress of the multilayer reflection film.

As a method for such stress reduction, there is known a method of heat treating the multilayer reflection film after it is formed on the substrate, thereby reducing the stress of the multilayer reflection film itself (see U.S. Pat. No. 6,309,705).

On the other hand, there is also known a method of forming, between the substrate and the multilayer reflection film, a stress correction film having a tensile stress equivalent to the compression stress of the multilayer reflection film, thereby canceling the stress of the multilayer reflection film (see Japanese Unexamined Patent Publication No. 2002-15981).

However, according to the above-mentioned method of heat treating the multilayer reflection film, for example, heat treatment at a high temperature of about 300° C. or higher is required in order that the compression stress of about 600 MPa approaches 0 (zero). However, it is not preferable to heat the multilayer reflection film at such a high temperature because the reflectance of the multilayer reflection film is lowered. This is presumably because diffusion occurs at an interface between respective layers of the multilayer reflection film.

On the other hand, according to the method of forming the stress correction film between the substrate and the multilayer reflection film, the stress correction film having high tensile stress (about 600 MPa in the above-mentioned case) opposite to the multilayer reflection film must be formed in order to cancel the stress of the multilayer reflection film. Generally, the film having high tensile stress has a rough surface. When the multilayer reflection film is formed on such a rough film, the multilayer reflection film is formed with the surface roughness reflected or copied thereon. As a consequence, the reflectance for the EUV light is lowered and, in an absorber pattern formed on the multilayer reflection film, edge roughness is increased, resulting in an adverse effect upon the shape accuracy. For example, a Si film of 0.29 µm and +600 MPa has roughness of 0.45 nmRms. The multilayer reflection film formed on the Si film has roughness of 0.55 nmRms, thereby causing about 3% reduction in reflectance. Therefore, it is not practically preferable to form the film having high tensile stress between the substrate and the multilayer reflection film.

SUMMARY OF THE INVENTION

It is therefore an object of this invention to provide a method of manufacturing a reflection type mask blank which is reduced in influence of stress of a multilayer reflection film and which is high in flatness as well as a method of manufacturing a reflection type mask.

The present inventors have enthusiastically studied in order to achieve the above-mentioned object and, as a result, found out that the above-mentioned object is achieved by forming a stress correction film having stress opposite in direction to that of a multilayer reflection film between a substrate and the multilayer reflection film, on the multilayer reflection film, or both between the substrate and the multilayer reflection film and on the multilayer reflection film, and heat-treating the multilayer reflection film and the stress correction film. Thus, the present invention has been completed.

Specifically, according to this invention, there is provided a method of manufacturing a reflection type mask blank by forming a multilayer reflection film reflecting exposure light on a substrate and forming an absorber layer absorbing the exposure light on the multilayer reflection film, the method comprising: a step of forming, between the substrate and the multilayer reflection film, on the multilayer reflection film, or both between the substrate and the multilayer reflection film and on the multilayer reflection film, a stress correction film having film stress opposite in direction to film stress of the multilayer reflection film and smaller in absolute value than the film stress of the
multilayer reflection film; a step of heat-treating the stress correction film; and a step of heat-treating the multilayer reflection film. After the heat treatment, the film stress of the stress correction film and the film stress of the multilayer reflection film are opposite in direction to each other and equal in magnitude to each other to be balanced so that the stresses are canceled by each other. Therefore, the stress correction film need not be given large stress for canceling the film stress of the multilayer reflection film upon deposition. Therefore, the surface roughness of the stress correction film is not increased.

It is noted here that the film stress of the stress correction film according to this invention is a value scaled to the film thickness equivalent to that of the multilayer reflection film unless otherwise specified. Specifically, assuming that A represents the stress per unit film thickness of the stress correction film and B represents the ratio in film thickness between the stress correction film and the multilayer reflection film (stress correction film thickness/multilayer reflection film thickness), the value scaled to the film thickness equivalent to that of the multilayer reflection film is represented by A×B.

The step of heat-treating the stress correction film and the step of heat-treating the multilayer reflection film can be carried out simultaneously.

Further, in case where the stress correction film is formed between the substrate and the multilayer reflection film, it is possible to form the stress correction film on the substrate, to heat-treat the stress correction film, to thereafter form the multilayer reflection film on the stress correction film, and to heat-treat the multilayer reflection film. In this event, the heat treatment is carried out in two steps.

The heat treatment is preferably carried out at a substrate heating temperature higher than a temperature upon depositing the stress correction film and not higher than 200° C. According to this invention, heat treatment at a high temperature is unnecessary and the reduction in reflectance of the multilayer reflection film can be avoided.

According to this invention, the film stress of the stress correction film and the film stress of the multilayer reflection film after the heat treatment must be opposite in direction to each other and equal in magnitude to each other. Therefore, taking the variation in film stress of the multilayer reflection film and the stress correction film caused by the heat treatment into consideration, the stress to be given to the stress correction film before the heat treatment is determined. It is desirable that the film stress of the stress correction film before the heat treatment falls within a range between 0 and +300 MPa. Herein, + (plus) of the film stress represents tensile stress while − (minus) represents compressive stress.

According to this invention, the film stress of the stress correction film and the film stress of the multilayer reflection film are canceled by each other after the heat treatment. As the stress correction film, it is possible to use a material in which the absolute value of the stress is increased by the heat treatment, i.e., the stress is shifted to a tensile direction.

The stress correction film is preferably made of an amorphous material comprising metal or alloy. Such material provides a film excellent in smoothness and facilitates adjustment of the value of the initial stress to be given to the stress correction film.

Moreover, a reflection type mask can be produced by forming a pattern on the absorber layer of the reflection type mask blank produced by the above-mentioned method of manufacturing the reflection type mask blank according to this invention. By the method of manufacturing the reflection type mask according to this invention, the reflection type mask reduced in influence of the stress of the multilayer reflection film and high in flatness can be obtained.

DESCRIPTION OF PREFERRED EMBODIMENT

Now, description will be made of an embodiment of this invention.

In this invention, a unit Rms representative of smoothness is a root-mean-square roughness and can be measured by the use of an interatomic force microscope. Flatness in this invention is a value indicating surface warp (deformation) given by TIR (total indicated reading). This value is an absolute value of a difference in level between a highest position on a substrate surface above a focal plane and a lowest position below the focal plane where the focal plane is a plane determined by the least square method on the basis of the substrate surface.

A reflection type mask blank manufactured by a method of this invention comprises a multilayer reflection film formed on a substrate to reflect EUV light as exposure light and an absorber layer formed on the multilayer reflection film to absorb the EUV light as the exposure light. A stress correction film is formed between the substrate and the multilayer reflection film, on the multilayer reflection film, or both between the substrate and the multilayer reflection film and on the multilayer reflection film. If necessary, a buffer layer which is resistant against etching environment upon formation of a pattern on the absorber layer and which protects the multilayer reflection film may be provided between the multilayer reflection film and the absorber film. A reflection type mask manufactured by a method of this invention is obtained by forming a pattern on the absorber layer of the reflection type mask blank.

The method of manufacturing the reflection type mask blank according to this invention will be described in conjunction with an example in which the buffer layer is provided.

At first, the substrate is prepared. On the substrate, the stress correction film having a predetermined film stress and the multilayer reflection film are successively formed. The substrate provided with the stress correction film and the multilayer reflection film is heat-treated so that film stress of the multilayer reflection film and film stress of the stress correction film are opposite in direction to each other and equal in magnitude to each other.

After the heat treatment, the buffer layer and the absorber layer are successively formed on the multilayer reflection film to thereby obtain the reflection type mask blank according to this embodiment.

Next, each production step will be explained.

At first, the preparation of the substrate will be explained.

The substrate used in this invention preferably has a low coefficient of thermal expansion within a range of $0\pm1.0\times10^{-7}/°C.$, more preferably within a range of $0\pm0.3\times10^{-7}/°C.$ in order to prevent distortion of the pattern caused by heat during exposure. As a material having such a low coefficient of thermal expansion within the above-mentioned range, any one of amorphous glass, ceramic, and metal may be used. For example, as the amorphous glass, $SiO_2$—$TiO_2$ glass or quartz glass may be used. As the crystallized glass, crystallized glass with β-quartz solid solution deposited therein or the like may be used. As the metal, Invar alloy (Fe—Ni alloy) or the like may be used.

Further, the substrate preferably has high smoothness and high flatness in order to obtain high reflectance and transfer accuracy. In particular, it is preferable to have the smoothness not greater than 0.2 nmRms (the smoothness in an area of 10 µm square) and the flatness not greater than 100 nm (the flatness in an area of 142 mm square).

Moreover, the substrate preferably has high rigidity in order to prevent deformation caused by the film stress of the film formed thereon. In particular, it is preferable to have Young's modulus as high as 65 GPa or more. Taking the above-mentioned respects into account, the substrate is selected and prepared.

Next, the formation of the stress correction film on the substrate will be explained.

The stress correction film in this invention is selected so as to have the stress opposite in direction to the stress of the multilayer reflection film. Generally, the multilayer reflection film is densely formed and has compression stress. Therefore, the stress correction film is selected from films having tensile stress.

For example, the stress correction film is selected so that the magnitude (absolute value) of the stress of the stress correction film is increased by the heat treatment. Specifically, the stress is shifted in the direction towards the tensile stress.

Further, the stress correction film is preferably smooth and, therefore, is preferably made of an amorphous material. The surface smoothness of the stress correction film is preferably 0.2 nmRms or less, more preferably 0.15 nmRms or less.

Use of a film easy in stress control is preferable because a value of an initial stress to be given to the stress correction film can readily be adjusted. As such a stress correction film, a material containing tantalum (Ta) as a major component is preferable.

As the material containing Ta as a major component, for example, Ta alloy or the like may be used. Further, an amorphous material containing Ta as a major component is preferable. As such a material, alloy containing tantalum and boron, for example, tantalum boron alloy (TaB) or tantalum boron nitride (TaBN) may be used.

For example, in case of the tantalum boron alloy, the film is preferably formed on the substrate by DC magnetron sputtering at room temperature in an Ar gas atmosphere. In this event, following an increase in gas pressure, the stress is varied from the compression stress towards the tensile stress. Accordingly, by changing the sputtering gas pressure with supply power kept constant, stress control can be finely adjusted.

In an alloy film containing Ta and B, the content of B is preferably within a range of 10–30 at % in order to obtain an excellent amorphous state. In case of an alloy film containing Ta, B, and N, it is preferable that the content of N is 5–30 at % and, assuming the amount of other components than N is 100 at %, the content of B is 10–30 at %.

As the stress correction film, a material containing Si as a major component may be used in addition to the above-mentioned materials. Specifically, elemental Si or additive-doped Si may be used. In this event, the additive may be nitrogen or oxygen. The material containing Si as a major component is preferably used in an amorphous state.

Further, as the stress correction film, a material containing Cr may be used also. For example, a material containing chromium and nitrogen or a material containing oxygen and/or carbon in addition thereto may be used. These materials containing Cr are superior in smoothness and cleaning resistance and are excellent in stress controllability.

As other stress correction films, use may be made of alloy of Ta and Ge, nitride of alloy of Ta and Ge, alloy of Ta and Si, nitride of alloy of Ta and Si, and alloy of W and N.

In these stress correction films, the value of the initial stress can be adjusted to a desired stress value by appropriately controlling a deposition method or a deposition condition. Further, by heating, the value of the stress is varied in a tensile direction. As the deposition method, the above-mentioned DC magnetron sputtering or the like may be used to form the film on the substrate.

In order to achieve the object of this invention, it is important that the stress correction film is formed on the substrate taking the following respects into account. Specifically, after the heat treatment which is performed in a later step, the film stress of the stress correction film and the film stress of the multilayer reflection film must be opposite in direction to each other and equal in magnitude to each other. Therefore, taking the variation in film stress of the multilayer reflection film and the stress correction film due to the heat treatment into consideration, the initial stress to be given to the stress correction film before the heat treatment and the film thickness are determined.

For example, in case where the structure of the multilayer reflection film is preliminarily determined, the relationship between the heat-treatment temperature and the variation in film stress of the multilayer reflection film after the heat treatment is obtained first. Then, in a predetermined material of the stress correction film, the relationship among the heat-treatment temperature, the film thickness, and the variation in film stress after the heat treatment is obtained. With reference to these information, the heat-treatment temperature, the stress to be initially given to the stress correction film, and the film thickness of the stress correction film are determined, taking the variation in film stress of both films into account, so that the film stress of the multilayer reflection film after the heat treatment and the film stress of the stress correction film after the heat treatment are opposite in direction to each other and substantially equal in magnitude to each other.

It is noted here that, if the initial stress given to the stress correction film is extremely high, the surface roughness is increased as described above and, therefore, the film stress given to the stress correction film is preferably on the order of 0 to +300 MPa (the value scaled to the film thickness equivalent to that of the multilayer reflection film).

In order to avoid an increase in surface roughness, it is desired that the film thickness of the stress correction film is small within a range such that desired film stress is obtained. The film thickness is preferably on the order of about 10–300 nm.

In this embodiment, the film stresses of the stress correction film and the multilayer reflection film are canceled by each other by the heat treatment performed in the later step. Therefore, it is unnecessary to form a film having high initial stress as the stress correction film. As a consequence, the surface roughness is suppressed small.

The preferred flatness of the substrate provided with the multilayer reflection film after the heat treatment is not greater than 100 nm. In this invention, after the heat treatment, the absolute values of the film stresses of the stress correction film and the multilayer reflection film need not exactly be equal to each other. It is required that the film stresses of the stress correction film and the multilayer reflection film are canceled by each other to the extent sufficient to obtain a predetermined flatness.

The stress correction film may be formed between the substrate and the multilayer reflection film as shown in this embodiment but may be formed on the multilayer reflection film. In this case also, the concept about the material, the deposition, and the design of the stress correction film is similar to that of the above-mentioned embodiment.

Next, the formation of the multilayer reflection film will be explained.

The multilayer reflection film in this invention has a structure in which materials different in refractive index are periodically laminated so as to reflect light having a specific wavelength. For example, for the exposure light (the EUV light) having a wavelength of about 13 nm, use is typically made of the multilayer reflection film comprising about 40 periods of alternate layers of Mo and Si. In case of the Mo/Si multilayer reflection film, a layer having relatively high refractive index is Mo while a layer having relatively low refractive index (refractive index being nearly equal to 1) is Si. The material forming the multilayer reflection film is appropriately selected in dependence upon the wavelength of the exposure light to be used. As other examples of the multilayer reflection film used in a region of the EUV light, use may be made of a Ru/Si periodic multilayer reflection film, a Mo/Be periodic multilayer reflection film, a Mo-compound/Si-compound periodic multilayer reflection film, a Si/Nb periodic multilayer reflection film, a Si/Mo/Ru periodic multilayer reflection film, a Si/Mo/Ru/Mo periodic multilayer reflection film, and a Si/Ru/Mo/Ru periodic multilayer reflection film.

The multilayer reflection film can be formed on the substrate or on the stress correction film, for example, by the DC magnetron sputtering. In case of the Mo/Si multilayer reflection film, 30–60 periods, preferably about 40 periods of Si and Mo are deposited in an Ar gas atmosphere by alternately using a Si target and a Mo target and a Si film is finally deposited. As another deposition method, IBD (Ion Beam Deposition) or the like may be used.

As described above, in designing the multilayer reflection film and the stress correction film, the variation in film stress of the multilayer reflection film after the heat treatment must be taken into account in advance.

Next, the heat treatment will be explained.

In this embodiment, the heat treatment for the stress correction film and the multilayer reflection film formed on the substrate is carried out so that the film stress of the stress correction film and the film stress of the multilayer reflection film are opposite in direction to each other and are substantially equal in magnitude (absolute value) to each other and that the film stresses are canceled by each other.

The force of a film is represented by a product of the film stress per unit film thickness and the film thickness. Therefore, it is necessary to balance the force of the multilayer reflection film and the force of the stress correction film by the heat treatment. For this purpose, the film stress of the stress correction film given by the value scaled to the film thickness equivalent to that of the multilayer reflection film and the film stress of the multilayer reflection film per unit film thickness are opposite in direction to each other and are substantially equal in magnitude (absolute value) to each other.

In the multilayer reflection film having high compression stress, the stress generally tends to be reduced (varied in the tensile direction to approach zero) by the heat treatment. Therefore, by the heat treatment, the magnitude of the film stress of the multilayer reflection film is reduced in absolute value.

On the other hand, in this invention, the material increased in absolute value of the stress by the heat treatment can be used as the stress correction film. Thus, as the stress correction film, the film having zero stress or the tensile stress opposite in direction to the stress of the multilayer reflection film is used and subjected to the heat treatment so that the stress of the stress correction film is varied in the direction such that the tensile stress is further increased.

Thus, before the heat treatment, the magnitude (absolute value) of the film stress (compression stress) of the multilayer reflection film is greater than the magnitude (absolute value) of the film stress (tensile stress) of the stress correction film and they are not balanced. However, by the heat treatment, the magnitude (absolute value) of the film stress (compression stress) of the multilayer reflection film is decreased and the magnitude (absolute value) of the film stress (tensile stress) of the stress correction film is increased, so that they are balanced and canceled by each other.

As described above, in order to cancel the film stress of the multilayer reflection film, the heat treatment temperature, the initial stress and the film thickness of the multilayer reflection film, and the initial stress and the film thickness of the stress correction film are designed, taking the variation in film stress of each of the multilayer reflection film and the stress correction film due to the heat treatment into account in advance.

If the heat treatment is performed at a high temperature, the reflectance of the multilayer reflection film is lowered. Therefore, the heat treatment is preferably carried out at the substrate heating temperature higher than the temperature upon deposition of the stress correction film and not higher than 200° C., more preferably not higher than 150° C. Further, in order to obtain sufficient variation in stress, a temperature not lower than 90° C. is preferable. The heat treatment time is a time sufficient to achieve the variation in film stress of each of the stress correction film and the multilayer reflection film due to the heat treatment and is typically about 1 hour.

In case where the stress correction film and the multilayer reflection film are simultaneously subjected to the heat treatment, the heat treatment may be performed in any one of the production steps as far as the heat treatment is carried out after the stress correction film and the multilayer reflection film are formed on the substrate. In view of less influence upon other layers, the heat treatment is preferably performed after the stress correction film and the multilayer reflection film are formed on the substrate and before other layers such as the buffer layer and the absorber layer are formed.

In the foregoing embodiment, description has been made of the case in which the stress correction film and the multilayer reflection film are formed on the substrate and, thereafter, simultaneously heated. However, in case where the stress correction film is formed between the substrate and the multilayer reflection film, it is possible to at first form the stress correction film on the substrate, to heat-treat the stress correction film before forming the multilayer reflection film so as to vary the stress of the stress correction film towards the tensile stress, to thereafter form the multilayer reflection film, and to heat-treat the multilayer reflection film. In this event, the heat treatment is carried out in two steps. However, by varying the stress of the stress correction film by the heat treatment before forming the multilayer reflection film, it is possible to perform the heat treatment at a relatively high temperature such that an influence would be given to the characteristics of the multilayer reflection film. Thus, it is possible to achieve large variation in stress of the stress correction film.

This invention utilizes cancellation of the film stress of the multilayer reflection film and the film stress of the stress correction film by the heat treatment. Therefore, upon deposition, the stress correction film need not be given large stress for canceling the film stress of the multilayer reflection film. As a consequence, the surface roughness of the stress correction film is not increased. Moreover, this invention simultaneously utilizes the reduction in stress of the multilayer reflection film by the heat treatment and the cancellation of the film stress of the multilayer reflection film by the stress correction film. Therefore, it is unnecessary to make the film stress of the multilayer reflection film itself approach zero exclusively by the heat treatment. Thus, the heat treatment at a high temperature is unnecessary and the reflectance of the multilayer reflection film is not lowered.

The variation in stress of the stress correction film due to the heat treatment is changed also in dependence upon the deposition condition (deposition temperature and the like) of the stress correction film. Therefore, the variation in stress of the stress correction film can be controlled by adjusting the deposition condition.

In the foregoing embodiment, description has been made of the stress correction film using the material which is increased in absolute value of the stress by the heat treatment but this invention is not restricted thereto. As far as a desired surface roughness (smoothness) can be obtained and the stress balance with the multilayer reflection film can be achieved by the heat treatment such that the reflectance of the multilayer reflection film is not affected, the stress correction film may be made of a material which is unchanged or only slightly decreased in stress by the heat treatment. Even if the stress correction film is unchanged or only slightly decreased in stress by the heat treatment, the stress thereof and the stress of the multilayer reflection film are canceled by each other after the heat treatment, so as to provide the solution to the surface roughness of the stress correction film and the decrease in reflectance of the multilayer reflection film.

Next, the formation of the buffer layer will be explained.

The buffer layer serves as an etch stopper layer to protect the multilayer reflection film as a lower layer when a transfer pattern is formed on the absorber layer, and is typically formed between the multilayer reflection film and the absorber layer. The buffer layer may be formed if desired.

As a material of the buffer layer, a material having high etching selectivity with respect to the absorber layer is selected. The etching selectivity between the buffer layer and the absorber layer is not smaller than 5, preferably not smaller than 10, more preferably not smaller than 20. Further, as the material of the buffer layer, a material low in stress and superior in smoothness is preferable. In particular, the smoothness not greater than 0.3 nmRms is preferable. From this viewpoint, the material for forming the buffer layer preferably has a microcrystal or an amorphous structure.

Generally, as a material of the absorber layer, Ta, Ta alloy, or the like is often used. In case where a Ta-based material is used as the material of the absorber layer, a material containing Cr is preferably used as the buffer layer. For example, use may be made of elemental Cr or a material containing Cr and at least one element selected from nitrogen, oxygen, and carbon added thereto. Specifically, chromium nitride (CrN) or the like is used.

On the other hand, in case where elemental Cr or a material containing Cr as a major component is used as the absorber layer, a material containing Ta as a major component, such as a material containing Ta and B or a material containing Ta, B, and N may be used as the buffer layer.

Typically, upon forming the reflection type mask, the buffer layer is removed in a patterned shape in conformity with the pattern formed on the absorber layer in order prevent the reduction in reflectance of the mask. However, if the buffer layer can be sufficiently reduced in thickness by the use of a material having high transmittance for the EUV light as the exposure light, the buffer layer may be left so as to cover the multilayer reflection film without being removed in the patterned shape.

For example, the buffer layer can be formed by sputtering, such as DC sputtering, RF sputtering, and ion beam sputtering.

The film stress of the buffer layer is preferably equal to zero. However, in case where the film stress of the buffer layer is not equal to zero or a value nearly equal to zero and no pattern is formed in the buffer layer when it is used as the reflection type mask, designing will be carried out, taking the film stress of the buffer layer into account also, so that the stresses of the buffer layer, the multilayer reflection film, and the stress correction film are balanced.

In case where another layer without a pattern, other than the buffer layer, is further provided, designing will be carried out in the similar concept.

Next, the formation of the absorber layer will be explained.

As the material of the absorber layer in this invention, a material high in absorptance for the exposure light and sufficiently high in etching selectivity with a layer (typically, the buffer layer or the multilayer reflection film) located below the absorber layer is selected. For example, a material containing Ta as a major metal component is preferable. In this case, if the buffer layer is made of a material containing Cr as a major component, high etching selectivity (10 or more) can be realized. Herein, the material containing Ta as a major metal element means a material in which Ta is metal having a greatest composition ratio among metal elements in the components. The material containing Ta as a major metal element for use as the absorber layer is typically metal or alloy. In view of the smoothness and the flatness, the amorphous or the microcrystal structure is preferable. As the material containing Ta as a major metal element, use may be made of a material containing Ta and B, a material containing Ta and N, a material containing Ta, B, and O, a material containing Ta, B, and N, a material containing Ta and Si, a material containing Ta, Si, and N, a material containing Ta and Ge, a material containing Ta, Ge, and N. By adding B, Si, or Ge to Ta, an amorphous material can be readily obtained so that the smoothness is improved. If N or O is added to Ta, resistance against oxidation is increased so that stability over time can be improved.

As other materials of the absorber layer, use may be made of a material containing Cr as a major component (chromium or chromium nitride, or the like), a material containing tungsten as a major component (tungsten nitride or the like), a material containing titanium as a major component (titanium or titanium nitride), or the like.

These absorber layers can be formed by the use of typical sputtering. In order to keep high shape accuracy and high positional accuracy of the pattern after forming the pattern, the absorber layer is preferably formed so that the stress is lessened.

In the above-mentioned manner, the reflection type mask blank in this embodiment can be obtained.

It is noted here that the reflection type mask blank in this embodiment may comprise still another layer or layers if desired.

Next, description will be made of a method of manufacturing the reflection type mask.

The reflection mask can be manufactured by forming the pattern on the absorber layer of the above-mentioned reflection type mask blank The formation of the pattern onto the absorber layer is carried out as follows. On the above-mentioned reflection type mask blank, a resist layer for electron beam writing is formed. By electron beam writing and development, a resist pattern is formed. Then, using the resist pattern as a mask, the absorber layer is etched by dry etching or the like. In case where the absorber layer is made of the material containing Ta as a major metal component, the pattern can be formed by dry etching using chlorine with the buffer layer serving as a protection layer for the multilayer reflection film. After the pattern of the absorber layer is formed, the resist layer left on the pattern of the absorber layer is removed. If desired, the buffer layer is removed in the patterned shape in conformity with the pattern of the absorber layer. For example, in case where a film containing Cr as a major component is used as the buffer layer, the buffer layer can be removed by dry etching using a mixed gas of chlorine and oxygen.

In the above-mentioned manner, the reflection type mask can be obtained.

As described above, in the method of producing the reflection type mask blank and the method of producing the reflection type mask according to this invention, the film stress of the multilayer reflection film and the film stress of the stress correction film are canceled by each other via the heat treatment and, by utilizing the cancellation, the affect of the film stress of the multilayer reflection film is reduced. As a consequence, the reflection type mask blank and the reflection type mask are obtained which are suppressed in roughening of the surface of the stress correction film, superior in flatness, and adapted to perform high-accuracy pattern transfer. Further, the heat treatment can be performed at a relatively low temperature so that the reflection type mask blank and the reflection type mask superior in flatness can be obtained without causing the decrease in reflectance of the multilayer reflection film.

EXAMPLES

Next, this invention will be explained more in detail in conjunction with examples of this invention.

Example 1

Figure 1:
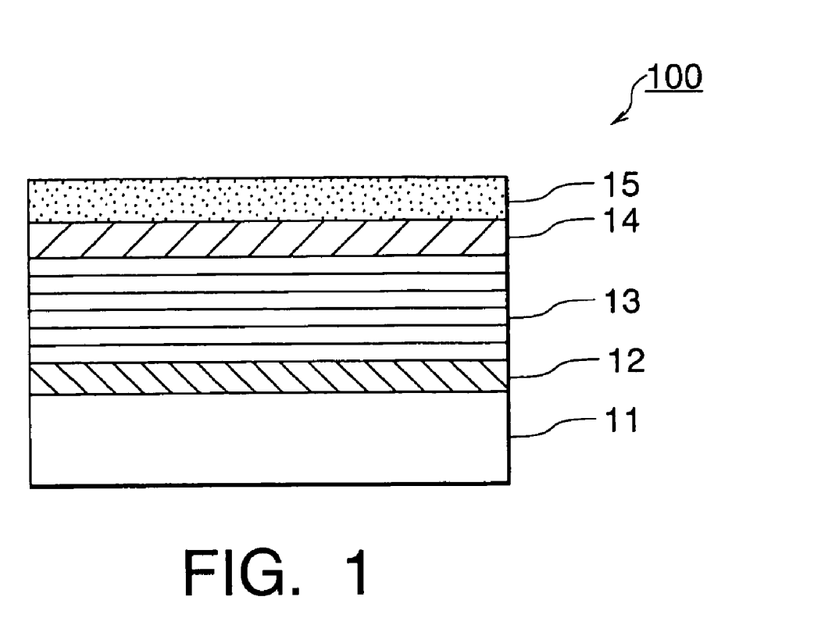
FIG. 1 is a sectional view of a reflection type mask blank according to this invention.
Figure 2:
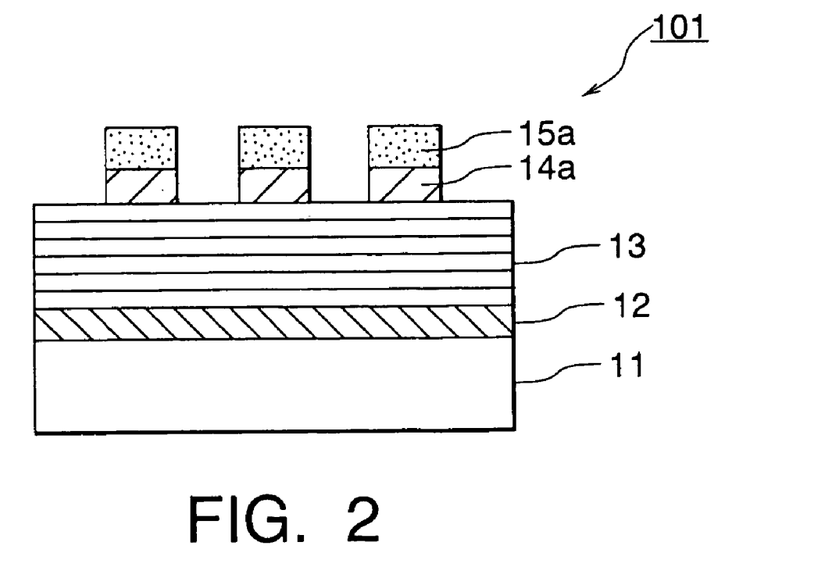
FIG. 2 is a sectional view of a reflection type mask.

Referring to FIG. 1 and FIG. 2, description will be made of a method of manufacturing an EUV reflection type mask blank 100 and an EUV reflection type mask 101 according to this example. FIG. 1 is a sectional view of the reflection type mask blank while FIG. 2 is a sectional view of the reflection type mask.

A substrate 11 was a $SiO_2$—$TiO_2$ based glass substrate (outer dimension of 6 inch square, thickness of 6.3 mm). The substrate 11 had a coefficient of thermal expansion of $0.2 \times 10^{-7}$/° C. and Young's modulus of 67 GPa. The glass substrate was subjected to mechanical polishing to have a smooth surface of 0.2 nmRms or less and a flatness of 100 nm or less.

At first, on the substrate 11, a film containing Ta and B was deposited to a thickness of 70 nm as a stress correction film 12. The deposition was carried out using a target containing Ta and B by the DC magnetron sputtering using Ar gas. At this time, by controlling the sputtering condition, the stress of the stress correction film 12 was adjusted to +600 MPa per unit film thickness. The composition ratio of Ta:B was 4:1 and the surface roughness on the surface of the stress correction film 12 was 0.14 nmRms.

The stress and the film thickness of the stress correction film 12 were determined taking into account the variation in film stress of the multilayer reflection film and the stress correction film during the heat treatment performed in a later step. The film stress of the stress correction film 12 was +145 MPa as scaled to the film thickness (290 nm) equivalent to that of the multilayer reflection film to be formed later.

Then, on the stress correction film 12, a multilayer reflection film 13 was formed.

As the multilayer reflection film 13, a Mo/Si periodic multilayer reflection film was used in this example in order to form a multilayer reflection film suitable for the exposure light wavelength band of 13–14 nm. The multilayer reflection film 13 was formed by alternately laminating Mo and Si on the substrate by the DC magnetron sputtering. At first using a Si target, a Si film was deposited to 4.2 nm under Ar gas pressure of 0.1 Pa. Thereafter, using a Mo target, a Mo film was deposited to 2.8 nm under Ar gas pressure of 0.1 Pa. The above-mentioned deposition is defined as one period. After lamination of 40 periods, another Si film was finally deposited to 10 nm. The total film thickness was 290 nm. The stress of the multilayer reflection film thus formed was −450 MPa.

For the multilayer reflection film, a peak reflectance was 65% at an incident angle of 5 degree within the exposure wavelength band. The surface roughness on the multilayer reflection film was 0.15 nmRms. The flatness of the surface of the multilayer reflection film was 800 nm.

In the above-mentioned manner, the substrate with the multilayer reflection film was obtained.

Next, the substrate with the multilayer reflection film thus formed was subjected to heat treatment. The heat treatment was carried out at the substrate heating temperature of 150° C. for one hour. As a consequence, the stress of the multilayer reflection film 13 was varied in the tensile direction to be equal to −300 MPa and, in the TaB film as the stress correction film 12, the stress per unit film thickness was varied to +1000 MPa. Specifically, the film stress of the stress correction film (the value scaled to the film thickness equivalent to that of the multilayer reflection film) was +241 MPa. By the heat treatment, the stress of the substrate with the multilayer reflection film as a whole was sufficiently lowered to −59 MPa (the value scaled to the film thickness equivalent to that of the multilayer film). The flatness of the substrate with the multilayer reflection film was 80 nm. Thus, the flatness is improved to about 1/10. For the substrate with the multilayer reflection film after the heat treatment, the reflectance was measured by the EUV light having the wavelength of 13.4 nm and the incident angle of 5°. As a result, the reflectance was equal to 65%. Thus, the reduction in reflectance was not observed as compared with the value before the heat treatment.

Then, after the heat treatment of the substrate with the multilayer reflection film, a chromium nitride (CrN) film as a buffer layer 14 was formed on the multilayer reflection film 13 to the thickness of 30 nm. The deposition was carried out by the DC magnetron sputtering using a Cr target and using nitrogen and Ar as sputter gas. In the deposited CrN film, the composition ratio of Cr:N was 9:1 and the crystalline state was polycrystal. Further, the film stress was +40 MPa as scaled to the equivalent film thickness of 50 nm.

Next, on the buffer layer 14 comprising the CrN film, alloy (TaBN film) containing tantalum, boron, and nitrogen was formed as an absorber layer 15 to the thickness of 50 nm. The deposition was carried out by the DC magnetron sputtering using a target containing Ta and B and using Ar with 10% nitrogen added thereto. At this time, by controlling the sputtering condition, the stress of the absorber layer 15 was adjusted to −50 MPa substantially equal in magnitude and opposite in direction to that of the chromium nitride film as the buffer layer. In the TaBN film thus deposited, Ta was 0.8, B was 0.1, N was 0.1, and the crystalline state was amorphous.

In the above-mentioned manner, the reflection type mask blank 100 in this example was obtained.

The following Table 1 collectively shows the film thickness, the surface roughness, the stress before and after the heat treatment, and the flatness for

TABLE 1

Example 1 (Heating Condition 150° C., 60 min)

|  | Material | Film Thickness nm | Surface Roughness mmRms | Before Heating | | | After Heating | | |
| --- | --- | --- | --- | --- | --- | --- | --- | --- | --- |
|  |  |  |  | Stress Mpa*) | Stress × Film Thickness Pa · cm | Flatness nm | Stress Mpa*) | Stress × Film Thickness Pa · cm | Flatness nm |
| Stress Correction Film | TaB (Ta:B = 4:1) | 70 | 0.14 | +145 (+600) | +4200 | 400 | +241 (+1000) | +7000 |  |
| Multilayer Reflection Film | Mo/Si 40 periods | 290 | 0.15 | −450 | −13050 | 1200 | −300 | −8700 |  |
| Stress Correction Film + Multilayer Reflection Film |  |  |  | −305 | −8850 | 800 | −59 | −1700 | 80 |

*)The value outside of ( ) shows the film stress corresponding to the film thickness of the multilayer reflection film, the value inside of ( ) shows the film stress per unit film thickness each of the stress correction film and the multilayer reflection film.

Next, using the EUV reflection type mask blank 100, the EUV reflection type mask having a pattern for a 16 Gbit-DRAM of a 0.07 μm design rule was manufactured by the method which will be described in the following.

At first, on the above-mentioned EUV reflection type mask blank 100, a resist for electron beam writing was applied and baked. Via electron beam writing and development, a resist pattern was formed.

Using the resist pattern as a mask, the EUV absorber layer 15 was dry etched with chlorine. Thus, on the EUV reflection type mask blank, an absorber layer pattern 15a was formed.

Further, the resist pattern left on the absorber layer pattern 15a was removed by hot sulfuric acid at 100° C. Next, using a mixed gas of chlorine and oxygen, the buffer layer 14 was dry etched in conformity with the absorber layer pattern 15a to thereby form a patterned buffer layer 14a.

In the above-mentioned manner, the reflection type mask 101 in this example was obtained.

Figure 3:
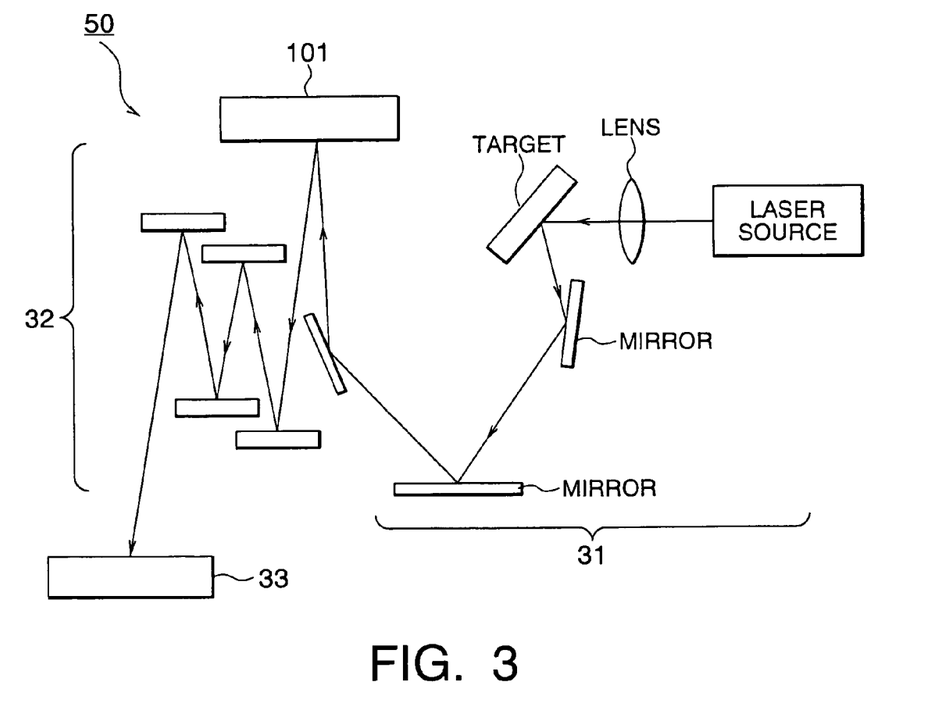
FIG. 3 is a general structural view of a pattern transfer apparatus to which the reflection type mask is mounted.

Next referring to FIG. 3, explanation will be made of the method of transferring the pattern by EUV light using the reflection type mask 101 onto a semiconductor substrate 33 with a resist. As illustrated in FIG. 3, a pattern transfer apparatus 50 with the reflection type mask mounted thereto generally comprises a laser plasma x-ray source 31, the reflection type mask 101, and a reduction optical system 32. The reduction optical system 32 comprises x-ray reflection mirrors. Through the reduction optical system 32, the pattern reflected by the reflection type mask 101 is typically reduced in scale to about ¼. Since the wavelength band of 13–14 nm is used as the exposure wavelength, adjustment was preliminarily made so that the optical path was positioned in vacuum.

In the above-mentioned state, the EUV light obtained from the laser plasma x-ray source 31 was made to be incident to the reflection type mask 101 and the reflected light was transferred via the reduction optical system 32 onto the semiconductor substrate (Si wafer) 33 with the resist.

In an area having the absorber layer pattern 15a, the light incident to the reflection type mask 101 was absorbed by the absorber layer without being reflected. On the other hand, the light incident to an area without the absorber layer pattern 15a was reflected by the multilayer reflection film 13. In this manner, an image formed by the light reflected from the reflection type mask 101 was incident to the reduction optical system 32. The exposure light passing through the reduction optical system 32 exposes the transfer pattern on the resist layer on the semiconductor substrate 33. By developing the exposed resist, the resist pattern was formed. As mentioned above, the pattern was transferred onto the semiconductor substrate. As a result, it was confirmed that the accuracy of the reflection type mask 101 was not greater 16 nm as the required accuracy in the 70 nm design rule.

Example 2

In this example, the reflection type mask blank was formed in the manner similar to Example 1 except that the condition upon deposition of the stress correction film 12 was changed and the film stress initially given to the stress correction film was +50 MPa and that the heat treatment condition was set at 200° C. for 60 minutes.

The following Table 2 collectively shows the film thickness, the surface roughness, the stress before and after the heat treatment, and the flatness for each of the stress correction film and the multilayer reflection film. In this example, the stress of the substrate with the multilayer reflection film as a whole was sufficiently lowered to +66 MPa (the value scaled to the film thickness equivalent to that of the multilayer film) by the heat treatment. The

TABLE 2

Example 1 (Heating Condition 200° C., 60 min)

| | | | | Before Heating | | | After Heating | | |
|---|---|---|---|---|---|---|---|---|---|
| | Material | Film Thickness nm | Surface Roughness mmRms | Stress Mpa*) | Stress × Film Thickness Pa · cm | Flatness nm | Stress Mpa*) | Stress × Film Thickness Pa · cm | Flatness nm |
| Stress Correction Film | TaB (Ta:B = 4:1) | 70 | 0.12 | +50 (+207) | +1450 | 75 | +266 (+1100) | +7700 | |
| Multilayer Reflection Film | Mo/Si 40 periods | 290 | 0.13 | −450 | −13050 | 1200 | −200 | −5800 | |
| Stress Correction Film + Multilayer Reflection Film | | | | −400 | −11600 | 1125 | +66 | +1900 | 85 |

*)The value outside of ( ) shows the film stress corresponding to the film thickness of the multilayer reflection film, the value inside of ( ) shows the film stress per unit film thickness flatness of the substrate with the multilayer reflection film was improved to 85 nm. For the substrate with the multilayer reflection film after the heat treatment, the reflectance was measured by the use of the EUV light having the wavelength of 13.4 nm and the incident angle of 5°. As a result, the reduction in reflectance was not observed as compared with the value before the heat treatment.

Next, using the EUV reflection type mask blank, the EUV reflection type mask having a pattern for a 16 Gbit-DRAM of a 0.07 μm design rule was manufactured in the manner similar to Example 1. Further, using the reflection type mask herein manufactured, the pattern was transferred onto the semiconductor substrate by the use of the pattern transfer apparatus in FIG. 3 in the manner similar to Example 1. As a result, it was confirmed that the accuracy of the reflection type mask of this example was not greater than 16 nm as the required accuracy in the 70 nm design rule.

Example 3

In this example, the stress correction film was not formed between the substrate and the multilayer reflection film but was formed on the multilayer reflection film (between the multilayer reflection film and the buffer layer). On the substrate, the multilayer reflection film and the stress correction film were successively formed. The heat treatment was carried out at 200° C. for 60 minutes after the stress correction film was formed on the multilayer reflection film. The stress correction film was formed by the use of a Ru film to the thickness of 10 nm. Except the above, the reflection type mask blank was formed in the manner similar to Example 1. The following Table 3 collectively shows the film thickness, the surface roughness, the stress before and after the heat treatment, and the flatness for each of the stress correction film and the multilayer reflection film in this example.

TABLE 3

Example 3 (Heating Condition 200° C., 60 min)
In case where the stress correction film is formed on the multilayer reflection film

| | | | | Before Heating | | | After Heating | | |
|---|---|---|---|---|---|---|---|---|---|
| | Material | Film Thickness nm | Surface Roughness mmRms | Stress Mpa*) | Stress × Film Thickness Pa · cm | Flatness nm | Stress Mpa*) | Stress × Film Thickness Pa · cm | Flatness nm |
| Stress Correction Film | TaB (Ta:B = 4:1) | 10 | 0.15 | +20 (+580) | +580 | 50 | +138 (+4000) | +4000 | |
| Multilayer Reflection Film | Mo/Si 40 periods | 290 | 0.15 | −450 | −13050 | 1200 | −200 | −5800 | |
| Stress Correction Film + Multilayer Reflection Film | | | | −430 | −12470 | 1150 | −62 | +1800 | 80 |

*)The value outside of ( ) shows the film stress corresponding to the film thickness of the multilayer reflection film, the value inside of ( ) shows the film stress per unit film thickness In this example, the stress of the substrate with the multilayer reflection film as a whole was sufficiently lowered to −62 MPa (the value scaled to the film thickness equivalent to that of the multilayer film) by the heat treatment. The flatness of the substrate with the multilayer reflection film was improved to 80 nm. For the substrate with the multilayer reflection film after the heat treatment, the reflectance was measured by the use of the EUV light having the wavelength of 13.4 nm and the incident angle of 5°. As a result, the reduction in reflectance was not observed as compared with the value before the heat treatment.

Next, using the EUV reflection type mask blank, the EUV reflection type mask having a pattern for a 16 Gbit-DRAM of a 0.07 μm design rule was manufactured in the manner similar to Example 1. Further, using the reflection type mask herein manufactured, the pattern was transferred onto the semiconductor substrate by the use of the pattern transfer apparatus in FIG. 3 in the manner similar to Example 1. As a result, it was confirmed that the accuracy of the reflection type mask of this example was not greater than 16 nm as the required accuracy in the 70 nm design rule.

Example 4

In this example, the reflection type mask blank was formed in the manner similar to Example 1 except that the stress correction film 12 in Example 1 was formed by the use of a CrN film to the thickness of 70 nm and that the heat treatment was performed at 200° C. for 60 minutes.

The following Table 4 collectively shows the film thickness, the surface roughness, the stress before and after the heat treatment, and the flatness for each of the stress correction film and the multilayer reflection film.

In this example, the stress of the substrate with the multilayer reflection film as a whole was sufficiently lowed to −40 MPa (the value scaled to the film thickness equivalent to that of the multilayer film) by the heat treatment. The flatness of the substrate with the multilayer reflection film was improved to 40 nm. For the substrate with the multilayer reflection film after the heat treatment, the reflectance was measured by the use of the EUV light having the wavelength of 13.4 nm and the incident angle of 5°. As a result, the reduction in reflectance was not observed as compared with the value before the heat treatment.

Next, using the EUV reflection type mask blank, the EUV reflection type mask having a pattern for a 16 Gbit-DRAM of a 0.07 μm design rule was manufactured in the manner similar to Example 1. Further, using the reflection type mask herein manufactured, the pattern was transferred onto the semiconductor substrate by the use of the pattern transfer apparatus in FIG. 3 in the manner similar to Example 1. As a result, it was confirmed that the accuracy of the reflection type mask of this example was not greater than 16 nm as the required accuracy in the 70 nm design rule.

Example 5

In this example, the reflection type mask blank was formed in the manner similar to Example 1 except that the stress correction film 12 in Example 1 was formed by the use of a Si film to the thickness of 50 nm and that the heat treatment was performed at 200° C. for 60 minutes.

The following Table 5 collectively shows the film thickness, the surface roughness, the stress before and after the heat treatment, and the flatness for each of the stress correction film and the multilayer reflection film.

In this example, the stress of the substrate with the multilayer reflection film as a whole was sufficiently lowered to −50 MPa (the value scaled to the film thickness equivalent to that of the multilayer film) by the heat treatment. The flatness of the substrate with the multilayer reflection film was improved to 45 nm. For the substrate with the multilayer reflection film after the heat treatment, the reflectance was measured by the use of the EUV light having the

TABLE 4

Example 4 (Heating Condition 200° C., 60 min)

|  | Material | Film Thickness nm | Surface Roughness mmRms | Before Heating ||| After Heating |||
|---|---|---|---|---|---|---|---|---|---|
|  |  |  |  | Stress Mpa*) | Stress × Film Thickness Pa · cm | Flatness nm | Stress Mpa*) | Stress × Film Thickness Pa · cm | Flatness nm |
| Stress Correction Film | CrN | 70 | 0.12 | +50 (+207) | +1450 | 75 | +160 (+660) | +4640 |  |
| Multilayer Reflection Film | Mo/Si 40 periods | 290 | 0.15 | −450 | −13050 | 1200 | −200 | −5800 |  |
| Stress Correction Film + Multilayer Reflection Film |  |  |  | −400 | −11600 | 1125 | −40 | +1260 | 40 |

*)The value outside of ( ) shows the film stress corresponding to the film thickness of the multilayer reflection film, the value inside of ( ) shows the film stress per unit film thickness

TABLE 5

Example 5 (Heating Condition 200° C., 60 min)

|  | Material | Film Thickness nm | Surface Roughness mmRms | Before Heating | | | After Heating | | |
|---|---|---|---|---|---|---|---|---|---|
|  |  |  |  | Stress Mpa*) | Stress × Film Thickness Pa · cm | Flatness nm | Stress Mpa*) | Stress × Film Thickness Pa · cm | Flatness nm |
| Stress Correction Film | Si | 50 | 0.15 | +40 (+232) | +1160 | 65 | +150 (+870) | +4800 |  |
| Multilayer Reflection Film | Mo/Si 40 periods | 290 | 0.15 | −450 | −13050 | 1200 | −200 | −5800 |  |
| Stress Correction Film + Multilayer Reflection Film |  |  |  | +410 | −11890 | 1135 | −50 | +1000 | 45 |

*)The value outside of ( ) shows the film stress corresponding to the film thickness of the multilayer reflection film, the value inside of ( ) shows the film stress per unit film thickness wavelength of 13.4 nm and the incident angle of 5°. As a result, the reduction in reflectance was not observed as compared with the value before the heat treatment.

Next, using the EUV reflection type mask blank, the EUV reflection type mask having a pattern for a 16 Gbit-DRAM of a 0.07 µm design rule was manufactured in the manner similar to Example 1. Further, using the reflection type mask herein manufactured, the pattern was transferred onto the semiconductor substrate by the use of the pattern transfer apparatus in FIG. 3 in the manner similar to Example 1. As a result, it was confirmed that the accuracy of the reflection type mask of this example was not greater 16 nm as the required accuracy in the 70 nm design rule.

Example 6

In this example, the reflection type mask blank was formed in the manner similar to Example 1 except that a TaB film was formed as the stress correction film between the substrate and the multilayer reflection film to the thickness of 70 nm and a Ru film was formed on the multilayer reflection film to the thickness of 5 nm and that the heat treatment was performed at 200° C. for 60 minutes.

The following Table 6 collectively shows the film thickness, the surface roughness, the stress before and after the heat treatment, and the flatness for each of the stress correction film and the multilayer reflection film.

In this example, the stress of the substrate with the multilayer reflection film as a whole was sufficiently lowered to −50 MPa (the value scaled to the film thickness equivalent to that of the multilayer film) by the heat treatment. The flatness of the substrate with the multilayer reflection film was improved to 45 nm. For the substrate with the multilayer reflection film after the heat treatment, the reflectance was measured by the use of the EUV light having the wavelength of 13.4 nm and the incident angle of 5°. As a result, the reduction

TABLE 6

Example 6 (Heating Condition 130° C., 60 min)

|  | Material | Film Thickness nm | Surface Roughness mmRms | Before Heating | | | After Heating | | |
|---|---|---|---|---|---|---|---|---|---|
|  |  |  |  | Stress Mpa*) | Stress × Film Thickness Pa · cm | Flatness nm | Stress Mpa*) | Stress × Film Thickness Pa · cm | Flatness nm |
| Stress Correction Film 1 (between Substrate and Multilayer Reflection Film) | TaB | 70 | 0.12 | +50 (+207) | +1450 | 75 | +120 (+497) | +3480 |  |
| Stress Correction Film 2 (on Multilayer Reflection Film) | Ru | 5 | 0.15 | +10 (+580) | +290 | 25 | +30 (+1740) | +870 |  |
| Multilayer Reflection Film | Mo/Si 40 periods | 290 | 0.15 | −450 | −13050 | 1200 | −200 | −5800 |  |
| Stress Correction Film + Multilayer Reflection Film |  |  |  | −390 | −11310 | 1100 | −50 | −1450 | 45 |

*)The value outside of ( ) shows the film stress corresponding to the film thickness of the multilayer reflection film, the value inside of ( ) shows the film stress per unit film thickness in reflectance was not observed as compared with the value before the heat treatment.

Next, using the EUV reflection type mask blank, the EUV reflection type mask having a pattern for a 16 Gbit-DRAM of a 0.07 μm design rule was manufactured in the manner similar to Example 1. Further, using the reflection type mask herein manufactured, the pattern was transferred onto the semiconductor substrate by the use of the pattern transfer apparatus in FIG. 3 in the manner similar to Example 1. As a result, it was confirmed that the accuracy of the reflection type mask of this example was not greater than 16 nm as the required accuracy in the 70 nm design rule.

As described above in detail, in the method of manufacturing the reflection type mask blank according to this invention, the stress correction film having the film stress opposite in direction to the film stress of the multilayer reflection film and smaller in absolute value than the film stress of the multilayer reflection film is formed between the substrate and the multilayer reflection film or on the multilayer reflection film. The multilayer reflection film and the stress correction film are heat-treated. Thus, after the heat treatment, the film stress of the stress correction film and the film stress of the multilayer reflection film are opposite in direction to each other and equal in magnitude to each other so that they are balanced. Consequently, the stresses are canceled. Therefore, the reflection type mask blank superior in flatness and adapted to perform high-accuracy pattern transfer can be obtained. Further, by utilizing cancellation of the film stress of the multilayer reflection film and the film stress of the stress correction film by the heat treatment, the affect of the film stress of the multilayer reflection film is reduced. As a consequence, the stress correction film need not be given large stress for canceling the film stress of the multilayer correction film upon deposition. Therefore, the reflection type mask blank suppressed in surface roughening of the stress correction film and superior in flatness is obtained.

If the above-mentioned heat treatment is carried out after the stress correction film and the multilayer reflection film are formed on the substrate, the stress correction film and the multilayer reflection film can be simultaneously heated so that the heating can be performed in one step.

In case where the stress correction film is formed between the substrate and the multilayer reflection film, it is possible to form the stress correction film on the substrate at first, to heat-treat the stress correction film, to thereafter form the multilayer reflection film, and to heat-treat the multilayer reflection film. In this manner, by heat-treating the stress correction film before the multilayer reflection film is formed, it is possible to carry out heat treatment at a relatively high temperature such that an influence would be given to the characteristics of the multilayer reflection film. Thus, it is possible to achieve large variation in stress of the stress correction film.

Moreover, in the method of manufacturing the reflection type mask blank according to this invention, it is not required to reduce the film stress of the multilayer reflection film only by the heat treatment. Therefore, the heat treatment at a high temperature is unnecessary and the above-mentioned heat treatment can be performed at a temperature not higher than 200° C. to thereby prevent the reflectance of the multilayer reflection film from being lowered.

In the method of manufacturing the reflection type mask blank according to this invention, it is required that the film stress of the stress correction film and the film stress of the multilayer reflection film are opposite in direction to each other and balanced in magnitude with each other after the heat treatment. Therefore, the film stress of the stress correction film before the heat treatment can be within the range between 0 and +300 MPa so that the surface roughness of the stress correction film can be decreased.

Further, in the method of manufacturing the reflection type mask blank according to this invention, the stress correction film is made of the material whose stress is increased in the tensile direction by the heat treatment. Thus, the magnitude of the initial stress given to the stress correction film can be reduced and the surface roughness of the stress correction film can be decreased.

Moreover, in the method of manufacturing the reflection type mask blank according to this invention, the stress correction film is made of an amorphous material comprising metal or alloy. This makes it possible to obtain the film excellent in smoothness and to readily adjust the value of the initial stress given to the stress correction film.

Further, the pattern is formed on the absorber layer of the reflection type mask blank produced by the above-mentioned method of manufacturing the reflection type mask blank. Consequently, the reflection type mask suppressed in influence of the stress of the multilayer reflection film and superior in flatness is obtained.

What is claimed is:

1. A method of manufacturing a reflection type mask blank by forming a multilayer reflection film reflecting exposure light on a substrate and forming an absorber layer absorbing the exposure light on the multilayer reflection film, the method comprising:
   a step of forming, between the substrate and the multilayer reflection film, on the multilayer reflection film, or both between the substrate and the multilayer reflection film and on the multilayer reflection film, a stress correction film having film stress opposite in direction to film stress of the multilayer reflection film and smaller in absolute value than the film stress of the multilayer reflection film;
   a step of heat-treating the stress correction film at a temperature higher than a deposition temperature of the stress correction film; and
   a step of heat-treating the multilayer reflection film at a temperature higher than the deposition temperature of the stress correction film,
   wherein the reflection multilayer film is made of a material selected so that the film stress is reduced by the heat treating step,
   the stress correction film is made of a material selected so that the stress is increased by the heat treating step, and
   the heat treating step is carried out at a heating temperature at which the film stress of the reflection multilayer film is cancelled by variation of the film stress of the stress correction film.

2. A method of manufacturing a reflection type mask blank as claimed in claim 1, wherein the step of heat-treating the stress correction film and the step of heat-treating the multilayer reflection film are carried out simultaneously.

3. A method of manufacturing a reflection type mask blank as claimed in claim 1, wherein the stress correction film is formed on the substrate, the stress correction film is heat-treated, the multilayer reflection film is thereafter formed on the stress correction film, and the multilayer reflection film is heat-treated.

4. A method of manufacturing a reflection type mask blank as claimed in any one of claims 1 through 3, wherein the heat treatment is carried out at a substrate heating temperature higher than a temperature upon deposition of the stress correction film and not higher than 200° C.

5. A method of manufacturing a reflection type mask blank as claimed in any one of claims 1 through 3, wherein the film stress of the stress correction film before the heat treatment falls within a range between 0 and +300 MPa.

6. A method of manufacturing a reflection type mask blank as claimed in any one of claims 1 through 3, wherein the stress correction film is increased in stress in a tensile direction by the heat treatment.

7. A method of manufacturing a reflection type mask blank as claimed in any one of claims 1 through 3, wherein the stress correction film is made of an amorphous material comprising metal or alloy.

8. A method of manufacturing a reflection type mask, wherein a pattern is formed on the absorber layer of the reflection type mask blank produced by the method claimed in any one of claims 1 through 3.

9. A method of manufacturing a semiconductor device, wherein a fine pattern is formed on a semiconductor substrate by lithography using the reflection type mask produced by the method claimed in claim 8.

10. A method of manufacturing a reflection type mask blank as claimed in claims 1 through 3, wherein the stress correction films is made of alloy of Ta and Ge, nitride of alloy of Ta or Ge or nitride of alloy of Ta and Si.

11. A method of manufacturing a reflection type mask blank as claimed in claims 1 through 3, wherein in the step of forming the stress correction film, the stress correction film formed on the multilayer reflection film is made of Ru.

* * * * *